United States Patent [19]

Alberkrack et al.

[11] 4,121,162

[45] Oct. 17, 1978

[54] DIGITAL PHASE LOCKED LOOP TUNING SYSTEM

[75] Inventors: Jade Henry Alberkrack; Stephen Earl Hilliker, both of Chandler, Ariz.

[73] Assignee: Motorola, Inc., Schaumburg, Ill.

[21] Appl. No.: 695,875

[22] Filed: Jun. 14, 1976

[51] Int. Cl.² ............................................. H04B 1/16
[52] U.S. Cl. .................................. 325/421; 325/457; 325/459; 325/468; 331/1 A
[58] Field of Search ..................... 325/418–423, 325/453, 457, 458, 459, 464, 465, 468; 331/1 A, 4, 25

[56] References Cited

U.S. PATENT DOCUMENTS

| | | | |
|---|---|---|---|
| 3,883,807 | 5/1975 | Alberkrack | 325/459 |
| 3,956,702 | 5/1976 | Tanaka | 325/459 |
| 3,980,951 | 9/1976 | Breeze et al. | 325/464 |
| 4,009,439 | 2/1977 | Rast | 325/421 |
| 4,024,476 | 5/1977 | Briggs | 325/421 |

OTHER PUBLICATIONS

"A Frequency Synthesizer for Television Receivers" by Breeze et al., Transactions BTR, 11/1974.
IEEE Transaction on Consumer Electronics, "Simplified TV Tuning System" by Hilliker, 2-1976.

*Primary Examiner*—Robert L. Griffin
*Assistant Examiner*—Jin F. Ng
*Attorney, Agent, or Firm*—Michael D. Bingham

[57] ABSTRACT

A phase locked loop circuit for use in an automatic frequency synthesizing system. The system includes a programmer circuit which is responsive to a channel number input signal and generates a first digital control signal which is representative of the selected channel number and a second digital control signal which is representative of a predetermined group of channel numbers. A programmable divider is controlled by the programming circuit and generates a digital output signal which causes the phase locked loop circuit to generate a desired system output frequency corresponding to the selected channel number input signal. The phase locked loop circuit includes automatic fine tuning and manual fine tuning features.

24 Claims, 9 Drawing Figures (1) $f_{LO} = N \times f_{REF}$
(2) $N = (N_P - A)P + A(P-1)$
(3) FOR $P = 11, (P-1) = 10, f_{REF} = 1$ MHz:

| CH# | $N_P$ | A | ÷N |
|---|---|---|---|
| 2 | 10 | 9 | 101 |
| 3 | 10 | 3 | 107 |
| 4 | 11 | 8 | 113 |
| 5 | 12 | 9 | 123 |
| 6 | 12 | 3 | 129 |
| 7 | 22 | 15 | 221 |
| 8 | 22 | 15 | 227 |
| 9 | 23 | 20 | 233 |
| 10 | 23 | 14 | 239 |
| ⋮ | ⋮ | ⋮ | ⋮ |

| GROUP | A | B | B' | A' |
|---|---|---|---|---|
| I | 13 | 4 | 1 | 10 |
| II | 15 | 3 | 0 | 11 |
| III | 31 | 4 | 1 | 28 |
| IV | 83 | 3 | 0 | 79 |
| AFT (CH#=13) | 54 | 3 | 0 | 50 |

(1) $N = (N_p - A)P + A(P-1)$ (2) FOR $P=6, (P-1)=5$:

| CH# | $(N_p-A)$ | A |
|---|---|---|
| 2 | 16 | 1 |
| 3 | 17 | 1 |
| 4 | 18 | 1 |
| 5 | 18 | 3 |
| 6 | 19 | 3 |
| 7 | 36 | 1 |
| 8 | 37 | 1 |
| 9 | 38 | 1 |
| ⋮ | ⋮ | ⋮ |
| 13 | 42 | 1 |
| 14 | 82 | 5 |
| 15 | 83 | 5 |
| ⋮ | ⋮ | ⋮ |
| 83 | 151 | 5 |

| GROUP | CH# | $(N_p-A)$ = | $(CH\#+B)$ | A | B |
|---|---|---|---|---|---|
| I | 2 | 16 | 2+14 | 1 | 14 |
| I | 3 | 17 | 3+14 | 1 | 14 |
| I | 4 | 18 | 4+14 | 1 | 14 |
| II | 5 | 18 | 5+13 | 3 | 13 |
| II | 6 | 19 | 6+13 | 3 | 13 |
| III | 7 | 36 | 7+29 | 1 | 29 |
| III | 8 | 37 | 8+29 | 1 | 29 |
| III | 9 | 38 | 9+29 | 1 | 29 |
| III | ⋮ | ⋮ | ⋮ | ⋮ | ⋮ |
| III | 13 | 42 | 13+29 | 1 | 29 |
| IV | 14 | 82 | 14+68 | 5 | 5 |
| IV | 15 | 83 | 15+68 | 5 | 5 |
| IV | ⋮ | ⋮ | ⋮ | ⋮ | ⋮ |
| IV | 83 | 151 | 83+68 | 5 | 5 |

(1) $N = (N_p - A)P + A(P-1)$
(2) $= (CH\# + B)P + A(P-1)$

DIGITAL PHASE LOCKED LOOP TUNING SYSTEM

BACKGROUND OF THE INVENTION

This invention relates to digital tuning systems, and more particularly, to a simplified digital phase locked loop (PLL) tuning system incorporating unique digital automatic fine tuning and manual fine tuning schemes.

Since the appearance of varactor tuners for television, many tuning address schemes have evolved for controlling them. PLL techniques have maintained a performance advantage but have suffered a cost disadvantage due to complexity, the high frequencies involved, the need for automatic fine tuning and in some localities, the need for a manual fine tuning arrangement. With the advances that have taken place in semiconductor technology in the last several years, the high operating frequencies no longer present a significant problem.

Prior art PLL systems for use in television tuners have not yet been able to incorporate an automatic fine tuning feature, nor have they been able to incorporate a manual fine tuning system which would enable the PLL tuning system to be intentionally offset in predetermined increments. Television sets normally have an automatic fine tuning (AFT) feature, but this is normally incorporated as a separate circuit which is not directly incorporated into the television tuner.

An additional disadvantage of prior art PLL systems which are designed for use in a television tuner environment is that they are highly complex and relatively expensive. In order to convert the channel number input into the proper digital control signals for the PLL, a relatively large ROM having a capacity on the order of 82 words by 12 bits was required. The best prior art PLL tuning systems require two high speed programmable counters which greatly increase the system complexity. This together with the large ROM which the system required, greatly decreased the cost effectiveness of the system so that commercial manufacturers were able to use these prior art PLL systems only in their most expensive commercial television receivers.

Therefore, it is a feature of this invention to provide a digital PLL tuning system which incorporates design techniques that vastly simplify the complexity of the PLL while at the same time allowing the system to meet the latest needs of a television tuning system or any other PLL tuning system which is addressed by a channel number.

It is another feature of this invention to provide a digital PLL tuning system that has the ability to automatically tune nonprecise station frequencies and the ability to be manually fine tuned.

It is yet another feature of the present invention to provide a digital PLL tuning system having only a single high speed programmable counter and requiring a ROM capacity of only 5 words by 9 bits.

It is still another feature of this invention to provide a digital PLL tuning system which performs the automatic fine tuning feature by utilizing the PLL tuning system as a digital discriminator.

It is yet another feature of this invention to provide a digital PLL tuning system incorporating a manual fine tuning (MFT) arrangement which is capable of intentionally offsetting the local oscillator frequency of a TV tuner in one megahertz steps or of offsetting TV IF frequency in steps of 125 kilohertz.

SUMMARY OF THE INVENTION

The preferred embodiment of the present invention includes a phase locked loop circuit means for an automatic frequency synthesizing system. The phase locked loop circuit means includes programming means which is responsive to an input signal representing a selected channel number for generating a first digital control signal representative of the selected channel number and for generating a second digital control signal representative of a predetermined group of channel numbers. A programmable divider means is coupled to the first and second digital control signals and generates a digital output signal representative of a desired system output frequency corresponding to the selected channel number.

The phase locked loop circuit means further includes an automatic fine tuning feature for fine tuning the phase locked loop output frequency to the exact frequency of the received signal. The system further includes a manual fine tuning provision which allows the phase locked loop operating frequency to be intentionally offset in predetermined increments.

BRIEF DESCRIPTION OF THE DRAWINGS

The invention is pointed out with particularity in the appended claims. However, other objects and advantages, together with the operation of the invention, may be better understood by reference to the following detailed description taken in connection with the following illustrations wherein:

DESCRIPTION OF THE PREFERRED EMBODIMENTS

Figures 1, 2, 6:
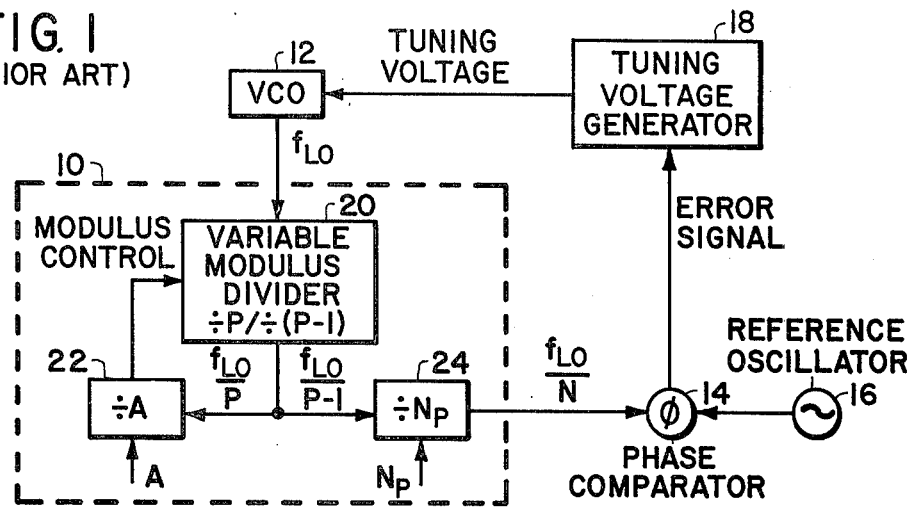
FIG. 1 is a generalized block diagram illustrating the PLL design utilized in the closest prior art PLL television tuning system.
FIG. 2 illustrates the operating equations and operating parameters required for use in the prior art PLL television tuning system shown in FIG. 1.
FIG. 6 is a table showing the final simplification of operating parameters required for use in the PLL television tuning system shown in FIGS. 3, 8 and 9.

Now referring to the drawings, and first to FIG. 1, a prior art PLL TV tuning system is shown. This system comprises a programmable divider means 10 which divides the local oscillator frequency generated by a voltage controlled oscillator 12 by a division ratio N. The output frequency $f_{LO}/N$ is coupled to a phase comparator 14 which compares this output frequency with the output frequency of a reference oscillator 16. If there is a difference in the two input frequencies to phase comparator 14 it generates an error signal which is coupled to a tuning voltage generator 18 which then ramps a tuning voltage in the proper direction to compensate for the frequency error sensed by phase comparator 14. This tuning voltage is coupled to voltage controlled oscillator 12 and corrects the local oscillator output frequency in the proper direction.

Programmable divider means 10 consists of a variable modulus divider 20 and two high speed programmable counters 22 and 24. Programmable counter 22 counts down from a number A, while programmable counter 24 counts down from $N_P$ before generating output signals. The programming means which generates the numbers A and $N_P$ is not shown in FIG. 1.

The variable modulus divider 20 is a divider capable of dividing by two fixed numbers: (P and P−1). The start of a cycle begins with counters 22 and 24 being loaded with numbers A and $N_P$, respectively. The mode of operation of divider 20 is controlled by the output of counter 22 which puts the variable modulus divider 20 in the ÷(P−1) mode first. The $f_{LO}$ input to the variable modulus divider 20 is then divided by (P−1) and this $f_{LO}/(P-1)$ output clocks counters 22 and 24 down from their initial programmed counts. When counter 22 reaches zero, its output changes state, changing the modulus of the variable modulus divider to the ÷P mode. The output of the dual modulus counter then becomes $f_{LO}/P$. Counter 22 now has a count remaining equal to the quantity ($N_P-A$). The output frequency of counter 24 is compared with the reference oscillator 16 output frequency.

In FIG. 2, equation (1) shows the basic PLL circuit operation. Equation (2) defines N, which is the division ratio of programmable divider 10. The table in the lower part of FIG. 2 illustrates the various values for $N_P$ and A for each choice of television channel number. As can be seen, there is no dependency between the channel number and the values in the $N_P$ column or the values in the A column. Therefore, the external programming means which must program counters 22 and 24 with values for A and $N_P$ must contain a ROM for storing each of the 82 values for both $N_P$ and A. The ROM used to store the data for $N_P$, A and the corresponding channel numbers requires a capacity of 82 words by 12 bits. The disadvantages of the circuit shown in FIG. 1 is that it requires a large capacity ROM and two high speed programmable counters 22 and 24. These requirements greatly increase the complexity and cost of the circuit.

Figures 3, 4:
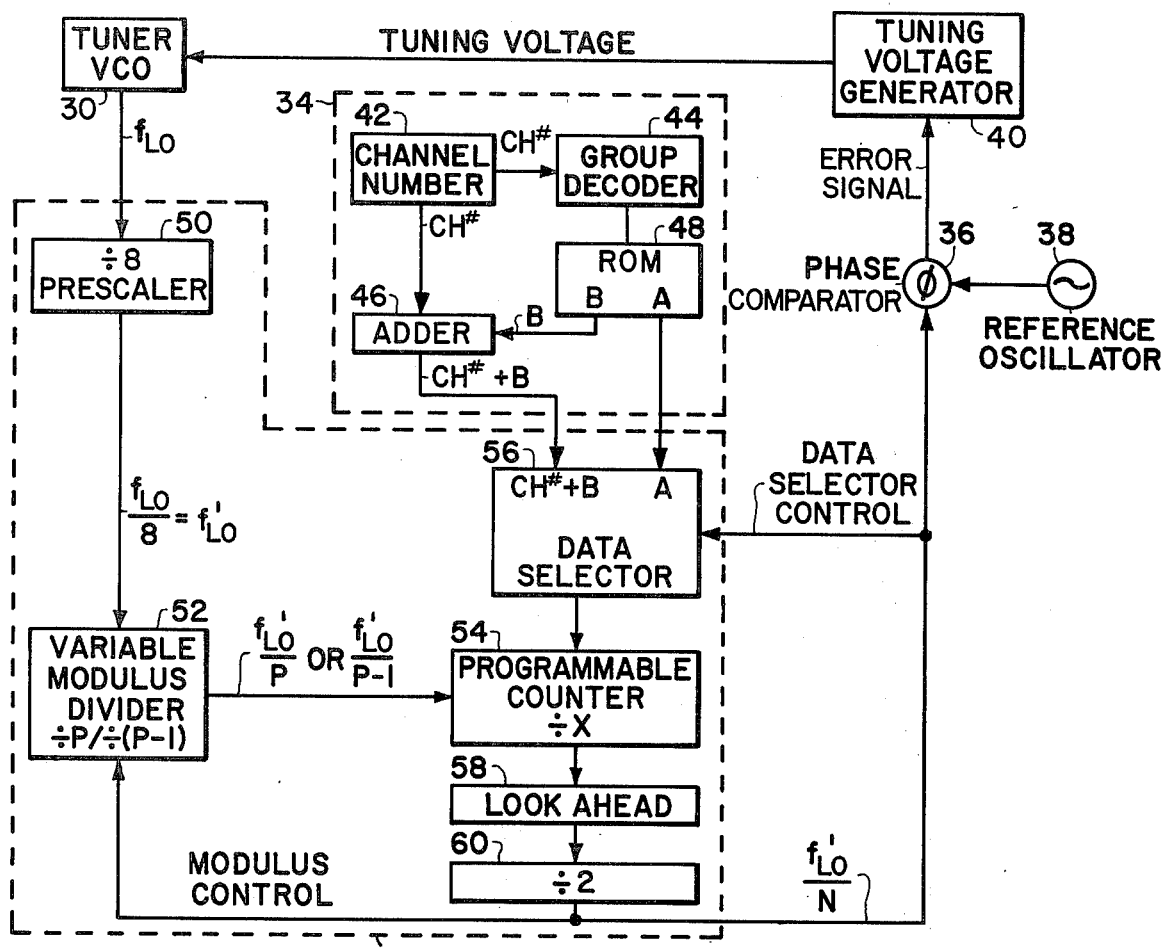
FIG. 3 is a generalized block diagram showing a simplified hardware embodiment of the invention without the AFT or MFT features.
FIG. 4 is a table illustrating the operating parameters required for use in the PLL television tuning system shown in FIG. 3.

FIG. 3 shows a simplified schematic diagram of one embodiment of the present invention. This particular embodiment does not include either the AFT or MFT features and is used primarily to simplfy the explanation of the operation of the preferred embodiment.

The PLL tuning system shown in FIG. 3 includes a tuner VCO 30 which generates a local oscillator frequency $f_{LO}$ which is coupled to programmable divider means 32. Programmable divider means 32 is controlled by programming means 34. The output of programmable divider means 32 is coupled to a phase comparator 36 which compares the output frequency of the programmable divider means with that from a reference oscillator 38. If there is a difference between these two input frequencies to phase comparator 36 an error signal is generated which controls the operation of a tuning voltage generator 40. The output of the tuning voltage generator 40 controls the operation of the tuner voltage controlled oscillator 30.

Programming means 34 includes a channel number generator 42 which generates a digital channel number output signal or first digital control signal which is coupled to a group decoder 44 and to an adder 46. Channel number generator 42 and adder 46 comprise a first logic means. The output of group decoder 44 is coupled to a ROM 48. The output of ROM 48 is coupled to adder 46. ROM 48 and group decoder 44 comprise a second logic means. The output of adder 46 and the remaining output of ROM 48 form the output control signals for the programming means 34. The two outputs from ROM 48 comprise a second digital control signal.

Programmable divider means 32 includes a divide by eight prescaler 50 which receives the $f_{LO}$ signal from tuner VCO 30. The output of prescaler 50 is coupled to a variable modulus divider 52. A programmable counter 54 receives the output from a data selector 56 and from the variable modulus divider 52. Data selector 56 receives the channel number plus B and the A outputs from the programming means 34. The output of programmable counter 54 is coupled to look ahead circuit 58. The output of look ahead circuit 58 is coupled to a divide by two counter 60. Divide by two counter 60 generates a single output signal which serves as a modulus control signal for controlling the variable modulus divider 52, as a data selector control signal for controlling the operation of data selector 56, and as the output of the programmable divider means 32 which is coupled to phase comparator 36. Data selector 56, programmable counter 54, look ahead circuit 58, and divide by two counter 60 are collectively referred to as a programmable counter means. Programmable divider means 32 and programming means 34 together implement equation (1) as shown in FIG. 4. This is the same equation which was used for the circuit shown in the prior art circuit of FIG. 1.

As can be seen from equation (3) of FIG. 2, the prior art PLL circuit utilized values of $P=11$ and $(P-1)=10$ and had a reference frequency of one megahertz. The use of values $P=1$ and $(P-1)=5$ as shown by equation (2) of FIG. 4 represents a substantial departure from the prior art.

The table illustrated in FIG. 4 shows the values of ($N_P-A$) and A for each of the channel members 2-83 for the new values of P and P−1.

Figures 5, 8:
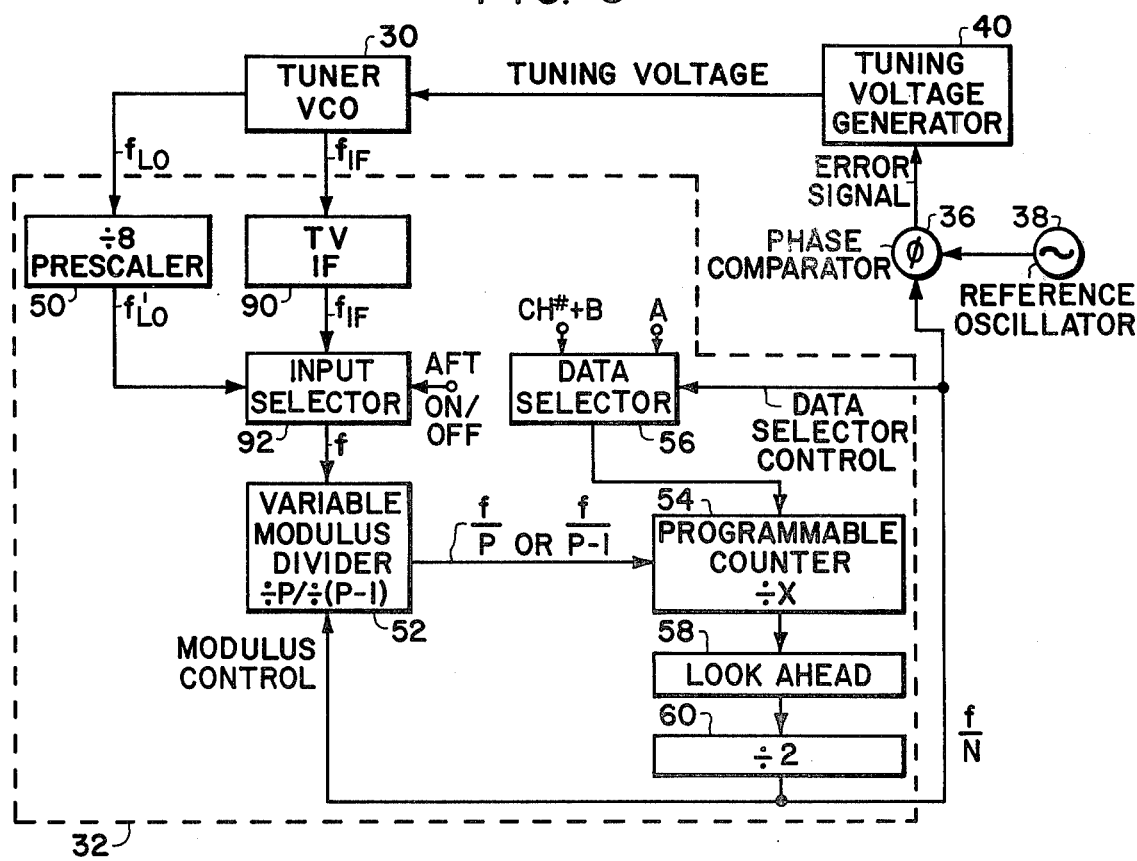
FIG. 5 is a table showing the first step in simplifying the operating parameters shown in FIG. 4.
FIGS. 8 and 9, taken together, comprise a complete generalized block diagram of the PLL television tuning system of the present invention incorporating the AFT and MFT features.

The table illustrated in FIG. 5 is used to explain how a highly significant simplification was made in the operation of the PLL television tuning system of the present invention. It was observed that when a value of $P=6$ was used that ($N_P-A$) was equal to a constant plus the channel number within each of four different groupings of channel numbers. For example, in group I for channel two, $(N_P-A) = 16$, which is equal to channel number 2 plus a constant value of 14. This type of relationship holds true within each of the four groups of television channel numbers. It was also observed that within each of these groupings of television channel numbers that the value of A also remained constant.

Therefore, instead of using the prior art equation (1) shown at the top of FIG. 5, a new equation (2) was used to represent N as is shown at the top of FIG. 5.

The resulting simplification due to the use of $P=6$, a rewriting of the equation for N, and a regrouping of channel numbers is illustrated in FIG. 6. While the prior art circuit shown in FIG. 1 required a separate value of $N_P$ and A for each of the 82 television channels, it can be seen that for the present invention only a single value of A and a single value of B is required for each of the four groups I, II, III, and IV. The ROM of the present invention must only store four pairs of numbers in order to generate 82 different frequencies corresponding to each of the 82 television channels. The value of the channel number itself is not required to be stored since the user of the television, by selecting the desired channel number, will cause the channel number to be an input directly to the programming means 34.

Referring now to FIG. 3, the operation of this version of the PLL television tuning system will be described. Reference oscillator 38 oscillates at a frequency of 125 kilohertz. The reason for choosing this particular value of reference oscillator frequency will be discussed below. In order to make this reference oscillator frequency the equivalent of a 1 megahertz reference oscillator frequency, the ÷8 prescaler 50 was inserted in the circuit and serves to effectively multiply the 125 kilohertz reference frequency by a factor of 8 such that it will be equivalent to a 1 megahertz reference frequency.

The mode of operation of the circuit shown in FIG. 3 will be discussed assuming that the user has selected channel number 2 which, as can be seen from FIG. 2, requires a ÷N equal to 101. The channel number generator 42 in the programming means 34, will read out the channel number 2 selection to group decoder 44 and to adder 46. Group decoder 44 decodes the channel 2 input signal and generates a group I output signal since channel 2 lies within group I. ROM 48 receives this group I signal and determines the appropriate values of A and B. As can be seen from FIG. 6 a group I selection requires values of $A=13$ and $B=4$. The B output of ROM 48 will generate a B output signal of 4 which is coupled to adder 46. Adder 46 then adds together the channel number 2 and the B value of 4 and generates a channel number plus B output signal equal to 6 at the channel number plus B input of data selector 56. The A output of ROM 48 generates an $A=13$ which is coupled to the A input of data selector 56.

Figure 7:
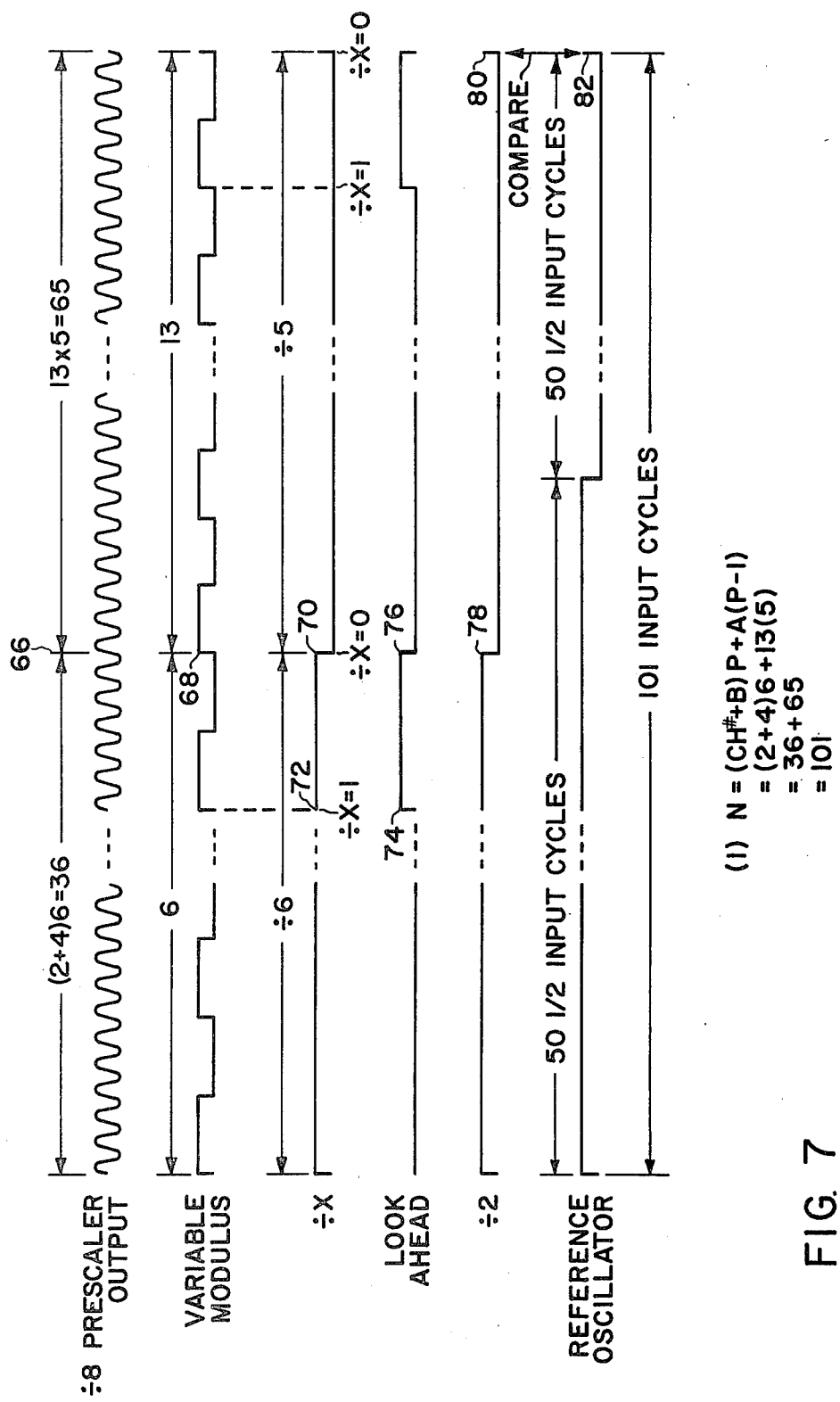
FIG. 7 is a timing diagram which is used to show the operating sequence of the circuit shown in FIG. 3.

FIG. 7 is a timing diagram showing the operation of each of the circuit elements of programmable divider means 32 for a channel selection of 2. Equation (1) in the lower part of FIG. 7 illustrates the numerical values of the equation for division ratio N which are being implemented by the programmable divider means 32.

Initially the output of ÷2 counter 60 is at a high level. This output serves as a modulus control signal which is coupled to variable modulus divider 52 and which causes divider 52 to divide by P which equals 6. Divider 52 receives an input signal from ÷8 prescaler 50. As can be seen from FIG. 7, divider 52 generates one complete square wave output for 6 complete input cycles. It should be pointed out at this point that the waveform shown in FIG. 7 is not drawn to scale as can be seen from the fact that there are 36 prescaler output cycles to the left of reference number 66 and 65 prescaler output cycles to the right of reference number 66.

At the same time that divider 52 began operating in the ÷P mode, data selector 56 selected the channel number plus B data input from the programming means and sent this data input to programmable counter 54. Since, for this example, the value of channel number plus B is equal to $2+4$ or a 6, programmable counter 54 will be set to count to 6 before it generates an output signal. Reference number 68 represents the point at which the variable modulus divider 52 will have generated six complete output cycles. At this time programmable counter 54 will have received six complete input cycles and it too will change state as is illustrated by the change in state occurring at reference number 70.

Look ahead circuit 58, however, is coupled not only to receive the output of programmable counter 54, but also to detect when the state or programmable counter 54 is at a count of 1. This particular event occurs at reference number 72. Look ahead circuit 58 therefore generates an output pulse at both reference number 74 and at reference number 76. ÷2 counter 60 receives each of these two output transitions from look ahead circuit 58 and changes state at reference number 78 after receipt of the second transition from look ahead circuit 58.

When the output of the ÷2 counter 60 changes from a high state to a low state at reference number 78, this first serves as a modulus control signal to change the division ratio of variable modulus divider 52 from P to $P-1$. Divider 52 now commences operating in a $(P-1)$ or ÷5 mode. This same output from ÷2 counter 60 also serves as data selector control input for data selector 56 and the change of state occurring at reference number 78 causes the data selector to now provide programmable counter 54 with an A input which is equal to 13.

Divider 52 at this point begins dividing by five so that five input cycles from the ÷8 prescaler 50 must be received for each output cycle generated by divider 52. Programmable counter 52 is now set to count down from 13 to 0. The operation of programmable divider means 32 is the same as was the case for a variable modulus divider state of $P=6$.

÷2 counter 60 after receiving the second transition from look ahead circuit 58 at reference number 80 again changes state. Phase comparator 36 compares the time at which this change of state at reference number 80 from ÷2 counter 60 occurs with the time at which the output of reference oscillator 38 occurs as is indicated at reference number 82. If, as is shown in FIG. 7, the change in state at reference numbers 80 and 82 coincide in time, the phase comparator will detect a zero error signal which signifies that the tuner VCO 30 is exactly on the desired output frequency. If the change in state from ÷2 counter 60 occurs at a point left of reference number 80 at a point earlier in time than the change in state of the reference oscillator signal shown at reference number 82, this signifies that the operating frequency of the tuner VCO 30 is higher than the desired channel two operating frequency. Conversely, if the change in output from ÷2 counter 60 occurs at a point to the right of reference number 80, this signifies that the output of tuner VCO 30 is below the desired channel two frequency and phase comparator 36 will generate an error signal to the tuning voltage generator 40 which will then generate a tuning voltage which will ramp the tuner VCO 30 in the proper direction to correct the frequency error.

Figure 9:
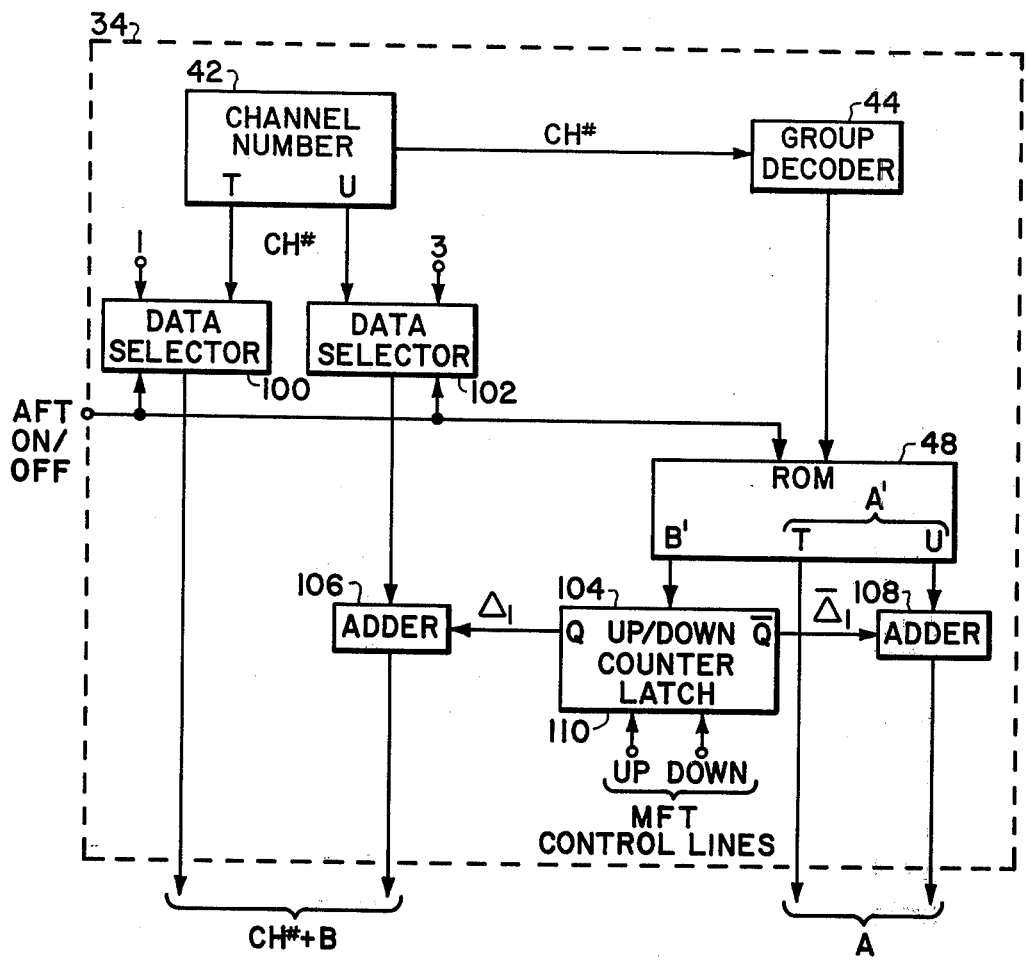

FIGS. 8 and 9 taken together show the preferred embodiment of the PLL tuning system of the present invention. This advanced tuning system includes both an automatic fine tuning (AFT) feature and a manual fine tuning (MFT) feature. The MFT feature provides the ability to intentionally offset the tuner VCO operating frequency. This advanced system operates in the same basic manner as the tuning system shown in FIG. 3.

For normal operation an AFT function would not be necessary since the reference oscillator 38 would not be necessary since the reference oscillator 38 would normally be a crystal oscillator having a tolerance of ±0.003% which would cause, at most, a frequency error of no more than ±30 kilohertz. However, the AFT function may become necessary because of nonprecise station frequencies which are found in many cable and master antenna systems which translate the incoming signal to a different frequency for transmission on a cable. In the AFT mode the tuning system uses the PLL as a digital discriminator.

In the AFT mode the IF frequency output from the tuner 30 is used. This IF frequency $f_{IF}$ passes through the television IF strip 90. When the AFT mode is selected an input selector 92 selects the output of the TV IF strip 90 instead of the output of ÷8 prescaler 50. This $f_{IF}$ signal is coupled to the input of variable modulus divider 52. The programming means 34 of FIG. 9 is simultaneously switched to a different set of parameters so that the programmable divider means 32 of FIG. 8 will be programmed to zero-in on the desired IF frequency of 45.75 megahertz.

Since 45.75 megahertz is not an integer, a one megahertz reference oscillator frequency would not have allowed proper PLL operation. The least common denominator of a 45.75 megahertz input signal is 250 kilohertz. However, a reference oscillator frequency of 125 kilohertz was chosen since this would allow the MFT mode to intentionally offset the frequency of operation in the AFT mode in 125 kilohertz increments. This was done since it was felt that in the AFT mode intentional offsets of 250 kilohertz would have been excessive. An added advantage of using a 125 kilohertz reference oscillator frequency was that in the local oscillator mode the $f_{LO}$ input frequency to the programmable divider means would be prescaled by a factor of 8 which lowers the maximum operating frequency at which the variable modulus divider 52 is required to operate.

The ÷N for the IF mode of the PLL equals 366 (366×125 kHz=45.75mHz). In order to generate this ÷N of 366 a channel number of 13, a B of 3 and an A of 54 are one possible combination of values which could be used. This is derived by inspection of the equation for N and these values are illustrated in the lower line of the Table shown in FIG. 6. The capacity of the ROM 48 was expanded to five words to include the extra values of A and B required for AFT operation.

The modifications to the programming means required to incorporate the AFT feature are illustrated in FIG. 9. The channel number generator 42 has been slightly modified so that it now reads out channel numbers on a ten's line and a unit's line. The ten's output of channel number generator 42 is coupled to data selector 100. The units output of channel number generator 42 is coupled to an input of data selector 102. When the AFT function is selected, the AFT on-off control input line to data selectors 100 and 102 causes the data selectors to generate a channel number output signal of 13 which is required for the AFT function. This is done by switching the input of data selector 100 from channel number generator 42 to a hardwired 1 input representing the ten's input of a channel 13 channel selection. Similarly, the input of data selector 102 is switched to a hardwired 3 input signal to generate the 3 corresponding to the unit's element of a channel 13 selection. Channel number generator 42 and data selectors 100 and 102 comprise channel number generator means the output of which is the first digital output signal.

From the table of FIG. 6 it can be seen that the value of B in the equation for the division ratio N is always equal either to a 4 or to a 3. Since this was the case, the size of the ROM was slightly reduced by utilizing a value of B' as is shown in the adjacent column in FIG. 6. B' varies in value between 1 and 0.

The B' output of ROM 48 drives an up/down counter latch 104. Latch 104 generates a binary output signal at its Q and $\overline{Q}$ outputs. The Q output of latch 104 is coupled to adder 106. The $\overline{Q}$ is the complement of the Q output and is coupled to adder 108. Latch 104 is designed such that a B' output of 1 causes latch 104 to generate a binary output signal equivalent to a 4 (100). This B' output of a 1 to latch 104 causes the $\overline{Q}$ output to produce a binary 3 (011) signal.

When the Q output of latch 104 is equal to a 3, the $\overline{Q}$ output is equal to a 4. The equations shown in the lower part of FIG. 9 are valid for the condition when the MFT feature is turned off. Due to the Q and $\overline{Q}$ outputs of latch 104 the value of A must now be adjusted to a new value equal to A'. The equations in the lower part of FIG. 9 and the right hand column of FIG. 6 indicate how the values of A' are arrived at. The operation of ROM 48 is essentially equivalent to that discussed in relation to FIG. 3. When the AFT control line switches to an on condition, the ROM is commanded to generate a B' output of zero to latch 104 and and A' output of 50 to adder 108. This completes the necessary input parameters for the operation in the AFT mode.

Now for a channel number selection number of 2, it can be seen that channel number greater 42 will generate a zero output at its ten output and a two output at its units output. Data selectors 100 and 102 will couple these two output signals straight through since the AFT mode has not been selected. The 2 input to adder 106 will be added to the value of $\Delta_1$. As can be seen from the table of FIG. 6, since channel 2 lies within group I, the value of B' will be a 1 which will cause latch 104 to generate a 4 output signal into adder 106. The output of data selector 102 and the output of latch 104 will be added together so that the channel number plus B output signal, which will be coupled to data selector 56, will be equivalent to a 6.

Group decoder 44 will cause ROM 48 to generate a value of A'=10 as can be seen from FIG. 6. Since the $\Delta_1$ output signal was equal to a 4, the $\overline{\Delta}_1$ output signal from latch 104 to adder 108 will be equal to a 3 so that the value of A'=10 generated by RPM 48 will be added to this additional 3 input in adder 108 generating a value of A=13. This will then cause the proper output from programming means 34 where channel number plus B equals 6 and A equals 13.

Group decoder 44, ROM 48, up/down counter latch 104 and adder 108 are collectively referred to as a second logic means. This second logic means generates a second digital control signal consisting of the $\Delta_1$ and A output signals.

These modifications to programming means 34 have resulted in a ROM having a capacity of five words by nine bits and enable the complete PLL tuning system to generate all 82 television channel frequencies and additionally enable the system to operate in the AFT mode such that it zeros in on a 45.75 megahertz IF signal.

The MFT feature can be used in either of two circumstances. First the MFT can be used to try to minimize picture interference from any cause such as adjacent channel interference. The MFT feature can intentionally offset the IF signal to a slightly different frequency to attempt to minimize this interference. Second, in cable TV and master antenna systems when a received television signal is translated to a different frequency for transmission on the cable, there are often frequency translation errors. These translation errors could be of sufficiently substantial enough magnitude that the AFT will be unable to lock on to the incoming signal. The result would be that this section could not be viewed. The MFT feature can then be used in the local oscillator mode to offset the local oscillator frequency in one magahertz steps to attempt to capture the desired input signal which is being received on an improper frequency.

In the preferred embodiment as shown in FIG. 9, the MFT can provide a positive or negative offset of up to either three increments, depending on the value of B. In the AFT mode when the MFT is switched on the IF frequency can be tuned up or down in increments of 125 kilohertz up to a maximum of 500 kilohertz. In the local oscillator mode the MFT feature can tune the local oscillator frequency in increments of one megahertz up to ±3 megahertz from the proper frequency.

To accomplish the MFT offset, the value of N is either increased or decreased in increments of one. For instance, in the AFT mode we can alter the IF frequency by increasing N by one to a value of 367. By reference to equation (2) of FIG. 5, it can be seen that this change in N of one can be accomplished by increasing B by 1 and decreasing A by 1. The MFT is controlled by the MFT control lines 110. To increase N by one, the MFT up line is pulsed one time. This causes up/down counter latch 104, which is generating a binary 3(011) on its Q output line, to count up to a binary 4(100) level. This causes the value of B to increase by 1 and simultaneously causes the value of A to decrease by 1. The value of A decreases by one since the $\bar{Q}$ output is equal to the complement of the Q output of up/down counter latch 104. $\bar{Q}$ changes from 4(100) to 3(011).

The operation of this PLL tuning system has been discussed utilizing values $P=6$ and $(P-1)=5$. It should also be pointed out that values of $P$ and $P'$ equal to the following pairs could also equally well be used: (6,7), (12,10), (12,14), (12,11), (12,13), etc. Each time the value of P is changed, of course, the respective values of A and B must also be changed, however, this is readily accomplished by any person skilled in the art. In fact, any value of $P=nS$ and $P'=P\pm M$, where $M=1,2,3$; $n=1,2,3$, and S is the channel spacing that can be used.

Furthermore, the PLL tuning system as illustrated in FIGS. 8 and 9 is readily adaptable for use in any environment where a channel number read out is used to select the desired output frequency. Two examples of this would be operation in the citizen's band where the user selects any one channel from channel 1 through channel 23 or in the aeronautical navigation system referred to as TACAN where the user selects the operating frequency by selecting a channel number between 1 and 126.

The only constraint on the utilization of this PLL tuning system is that there must be even spacing between output frequencies lying within any given group. As was the case in the PLL tuning system adapted for use in the television receiver, the operating frequencies can lie within a number of separate groups where the frequency spacing between groups is irregular but with uniform spacing within each group. The following generalized equation can be used to determine a value for P which is suitable for use in any form of PLL tuning system which satisfies the above requirements of channel number input and spacing between channels:

$D_i$ = the desired operating frequency and where $i$ corresponds to the selected group number $S$ = the frequency spacing between channels
$X_i = [D_i/S]$ rounded off to the nearest integer
$Y_i = D_i - X_i S$
$P = S/|Y'|$ where $Y'$ is chosen such that $Y_i/Y'$ is an integer and $S/Y'$ is an integer.

It may turn out that the value of Y may differ for each group of output frequencies. If this is the case then the PLL designer must compute the values of X and Y for each group. After this is done, the designer must select the smallest value of Y and use that in the equation for P. Once the value for P has been selected the second division ratio of the variable modulus divider 52, which is referred to as P', can readily be selected. The value of P' can lie either above or below the value of P.

Recently there has been discussion that the FCC may allocate additional frequencies for use in the citizen's band. These frequencies would be designated by channel numbers 24 to 46. The way these channel numbers would be implemented would be to have channel 24 lying between channel 23 and channel 22, channel 25 lying between channels 22 and 21, etc. The MFT design concept as discussed in connection with the programming means of the present invention is readily adaptable to this kind of use where the operating frequency of the PLL decreases as the channel number increases.

It will be apparent to those skilled in the art that the disclosed PLL tuning system apparatus may be modified in numerous way, some of which have been mentioned above, and may assume many embodiments other than the preferred forms specifically set out and described above. Accordingly, it is intended by the appended claims to cover all such modifications of the invention which fall within the true spirit and scope of the invention.

What is claimed is:

1. A digital phase locked loop tuning system responsive to a local oscillator signal for producing a frequency synthesized digital output signal which is utilized to control the frequency of the local oscillator, the local oscillator having a plurality of frequencies associated therewith corresponding, respectively, to a plurality of selectable channels, each of the channels being allocated to one of at least two channel groups with each channel in a particular channel group being separated from an adjacent channel in the particular channel group by a predetermined frequency spacing of the local oscillator, comprising:

programming means responsive to an input signal representing a selected channel number of a particular channel group for generating a first digital control signal having a value corresponding to the selected channel number and for generating a second digital control signal representative of said particular channel group, said second digital control signal being a constant predetermined value for all of said channel numbers that are within said group; and programmable divider means coupled to said programming means being responsive to said first, second digital control signals and the local oscillator signal, in a local oscillator mode, for generating the digital output signal which is representative of a desired frequency corresponding to said selected channel number, said programmable divider means including means for dividing the local oscillator signal by first and second factors, said first factor being related to the frequency separation between local oscillator signals by an integral number, the local oscillator signal being divided by said first factor during a first interval for a first number of periods of the output signal and being divided by said second factor for a second number of periods of the output signal, said first number of periods being related to the number of the channel selected, said second number being related to the channel group within which the selected channel lies.

2. Phase locked loop system according to claim 1, wherein said programming means including means coupled to said programming means for receiving an MFT signal and being responsive to said MFT signal for altering said first and second digital control signals, and said programmable divider means being responsive to said altered digital control signals for generating an altered system output frequency.

3. Phase locked loop system according to claim 2, wherein said programming means includes first terminal means coupled to said programming means for receiving an AFT control signal, and first logic means responsive to the input signal and the AFT control signal for generating the first digital control signal.

4. Phase locked loop system according to claim 3, wherein said programming means includes second logic means coupled to said first logic means and responsive to the AFT control signal for generating the second digital control signal.

5. Phase locked loop system according to claim 4, wherein said second logic means includes group decoder means coupled to said first logic means.

6. Phase locked loop circuit means according to claim 5, wherein said second logic means includes memory means coupled to said group decoder means and to said first terminal means.

7. Phase locked loop system according to claim 6, wherein said second logic means includes second terminal means for receiving an MFT signal, and up/down counter latch means coupled to said memory means and to said second terminal means for altering said first and second digital control signals in response to said MFT signal.

8. Phase locked loop system according to claim 7, wherein said second logic means includes adder means coupled to said up/down counter latch means to said memory means.

9. Phase locked loop system according to claim 3, wherein said first logic means includes channel number generator means coupled to said first terminal means and responsive to said input signal.

10. Phase locked loop system according to claim 9, wherein said channel number generator means includes first and second data selector means coupled to said first terminal means, and adder means coupled to said second data selector means and to said up/down counter latch means.

11. Phase locked loop system according to claim 1, wherein said means for dividing the local oscillator signal includes programmable counter means for generating a modulus control output signal, and variable modulus prescaler divider means coupled to and responsive to said programmable counter means, said variable modulus prescaler divider means dividing the local oscillator signal by said first and second factors.

12. Phase locked loop system according to claim 11, wherein said programmable counter means includes third data selector means coupled to receive said first and second digital control signals and said modulus control signal.

13. Phase locked loop system according to claim 12, wherein said programmable counter means includes a programmable counter coupled to said third data selector means and to said variable modulus prescaler divider means.

14. Phase locked loop system according to claim 13, wherein said programmable counter means includes look ahead circuit means coupled to said programmable counter, and divide by two circuit means coupled to said look ahead circuit means for generating said modulus control output signal.

15. Phase locked loop tuning system according to claim 1 including digital automatic fine tuning (AFT) means wherein:
said programmable divider means includes switching means responsive to an AFT control signal to inhibit the local oscillator signal to said programmable divider means and to provide an input signal thereto of a different frequency than the local oscillator signal; and
said programming means including logic means responsive to said AFT control signal for altering said first and second digital control signals to predetermined values to cause the phase locked loop tuning system to be operable in an automatic fine tuning mode.

16. Phase locked loop tuning system of claim 15 wherein said programmable divider means includes:
programmable counter means for generating first and second modulus control signals; and
dual modulus prescaler means responsive to said first modulus control signal for dividing the local oscillator signal in said local oscillator mode and said input signal of a different frequency in said automatic fine tuning mode by said first factor which is equal to the integer six and being responsive to said second modulus control signal for dividing said local oscillator signal and said input signal of a different frequency by said second factor which is equal to the integer five respectively.

17. Phase locked loop tuning system of claim 16 wherein said signal of a different frequency is an intermediate frequency signal provided by the tuning system and supplied to said switching means.

18. In a phase locked loop tuning system for receiving a channel number input signal and a local oscillator signal having groups of selectable frequencies wherein the frequency spacing between each adjacent local oscillator frequency within a single group is uniform, the improvement comprising programmable divider means for generating a digital output signal representative of a desired tuning system output frequency including variable modulus prescaler divider means having a prescaler division ratio being equal to $P = S/Y'$ for dividing the local oscillator frequency by said prescaler division ratio during a first interval for a first number of periods of the digital output signal and for dividing the local oscillator frequency by a second prescaler division ratio during a second interval for a second number of periods, said second ratio being related to said first ratio, where S is the frequency spacing between each adjacent local oscillator frequency within a single group (i), $Y_i = D_i - X_i S$, where $D_i$ is said desired tuning system output frequency within said selected group; $X_i = D_i/S$ rounded off to the nearest integer; $Y'$ is chosen such that $Y_i/Y'$ is an integer and $S/Y'$ is an integer and $Y'$ is the smallest value of all values of $Y_i$.

19. In a receiver including a tuning apparatus for providing a plurality of local oscillator signals each corresponding to a respective one of a plurality of selectable channels, each of the channels being allocated to one of at least two channel groups wherein each channel is separated from an adjacent channel in the respective channel group by a predetermined frequency spacing, a phase locked loop tuning system for producing a frequency synthesized output signal for controlling the frequency of the local oscillator, comprising:

variable modulus divider means for selectively dividing the frequency of the local oscillator signal by first and second factors in response to a modulus control signal to provide an output signal, said first factor being related to the frequency separation between local oscillator signals by an integral number; and programmable means for generating said modulus control signal to cause said variable modulus divider means to divide by said first factor during a first interval for a first number of periods of said output signal and to divide by said second factor during a second interval for a second number of periods of said output signal, said first number of periods being related to the number of the channel selected, said second number of periods being related to the channel group corresponding to the selected channel.

20. The phase locked loop tuning system of claim 19 wherein said programmable means includes:

programming means responsive to a selected channel input signal for producing first and second digital output signals, said first digital output signal being related to the selected channel number plus one of two constant values which are determined in accordance within which channel group the selected channel input signal lies, said second digital signal being a constant value for all selected channels within a channel group; and programmable divider means responsive to said first and second digital output signals from said programming means for providing said variable modulus control signal and the frequency synthesized output signal.

21. The phase locked loop tuning system of claim 20 wherein said programming means includes automatic fine tuning (AFT) means responsive to a AFT control signal being applied thereto when the receiver is placed in an AFT mode wherein:

said variable modulus divider means is caused to receive a input signal different from the local oscillator signal;

said programming means being responsive to the AFT control signal for altering said first and second digital signals such that the receiver is finely tuned to the frequency of the received signal applied to the receiver.

22. The phase locked loop tuning system of claim 21 wherein said programming means includes means for receiving a manual fine tuning (MFT) signal for altering said first and second digital output signals, and said programmable divider means being responsive to said altered digital control signals for generating an altered output signal.

23. The phase locked loop tuning system of claim 19 wherein the one of said first and second factors is an even number and the other is an odd number.

24. The phase locked loop tuning system of claim 23 wherein said first factor is the integer six and said second factor is the integer five.

* * * * *